United States Patent
Orita et al.

(10) Patent No.: US 6,673,702 B2
(45) Date of Patent: Jan. 6, 2004

(54) METHOD FOR PRODUCING A SEMICONDUCTOR DEVICE

(75) Inventors: Kenzi Orita, Osaka (JP); Masahiro Ishida, Osaka (JP); Masaaki Yuri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/748,436

(22) Filed: Dec. 26, 2000

(65) Prior Publication Data

US 2001/0021572 A1 Sep. 13, 2001

(30) Foreign Application Priority Data

Dec. 27, 1999 (JP) .............................. 11-369871
Feb. 4, 2000 (JP) ........................ 2000-027453

(51) Int. Cl.[7] .............................................. H01L 21/00
(52) U.S. Cl. ......................... 438/507; 438/508; 438/46
(58) Field of Search ........................... 216/63, 37, 74, 216/77; 438/694, 715, 717, 45, 46, 47, 508, 507, 503, 509, 535

(56) References Cited

U.S. PATENT DOCUMENTS 4,335,506 A  *  6/1982  Chin et al. ..................... 29/591
5,814,239 A  *  9/1998  Kaneko et al. ................ 216/63
5,868,855 A     2/1999  Fukazawa et al.
5,912,477 A  *  6/1999  Negley ......................... 257/95
6,001,744 A    12/1999  Doi
6,117,700 A  *  9/2000  Orita et al. .................... 438/46
6,235,548 B1 *  5/2001  Ota et al. ...................... 438/46

FOREIGN PATENT DOCUMENTS

| JP | 8-250460 | 9/1996 |
| JP | 09232681 A | 9/1997 |
| JP | 10-120498 | 5/1998 |
| KR | 1996-35859 | 10/1996 |
| KR | 1998-19152 | 6/1998 |
| WO | 97/08356 | 3/1997 |

* cited by examiner

Primary Examiner—Carl Whitehead, Jr.
Assistant Examiner—Laura M Schillinger
(74) Attorney, Agent, or Firm—Merchant & Gould P.C.

(57) ABSTRACT

A method for producing a semiconductor device of the present invention includes: heating a first semiconductor layer made of a Group III nitride-based compound semiconductor in gas containing nitrogen atoms; and growing a second semiconductor layer made of a Group III nitride-based compound semiconductor on the first semiconductor layer.

4 Claims, 12 Drawing Sheets

METHOD FOR PRODUCING A SEMICONDUCTOR DEVICE

BACKGROUND OF THE INVENTION

1. Field of the Invention

The present invention relates to a method for producing a semiconductor device using a Group III nitride-based compound semiconductor.

2. Description of the Related Art

In recent years, a blue-light semiconductor laser using a Group III nitride semiconductor such as GaN has been extensively developed. Such a blue-light semiconductor laser can be used as a light source for an optical disk reproduction apparatus.

In the case of producing a blue-light semiconductor laser, it is sometimes required alternately to repeat crystal growth in a vacuum apparatus and an operation in the air. For example, in the case of producing an embedded ridge type laser, a Group III nitride semiconductor layer is formed on a substrate in a vacuum apparatus, and then, the substrate is exposed to the air to form a current confinement layer. Thereafter, the substrate is placed again in the vacuum apparatus, and another Group III nitride semiconductor layer is grown on the Group III nitride semiconductor layer. In this case, an oxide layer is formed or impurities adhere to the surface of the first semiconductor layer during exposure to the air. Therefore, it is particularly important to conduct surface treatment of the first semiconductor layer after exposure to the air. In the surface treatment, it is required to remove the oxide layer and the impurities adhering to the surface of the semiconductor layer while preventing the surface of the semiconductor layer from being roughened.

Conventionally, a method for treating the surface of a Group III nitride semiconductor layer has been reported. For example, a method has been reported for treating a substrate, on which a semiconductor layer made of GaN is formed by epitaxial growth, (hereinafter, referred to as an "epitaxial substrate"), using heated concentrated phosphoric acid. Further, a method has been reported for electrolytically etching an epitaxial substrate in an alkaline solution. Further, a method has been reported for etching an epitaxial substrate soaked in an alkaline solution by irradiating light having energy larger than the bandgap energy of GaN thereto (JP 9(1997)-232681). According to the method using an alkaline solution, an electric current is applied or light is radiated so as to increase an etching rate with respect to GaN.

However, according to a method for conducting surface treatment by using heated concentrated phosphoric acid, the surface flatness of a semiconductor layer is decreased due to the inconsistencies in the temperature of the heated concentrated phosphoric acid. Further, according to a method for etching in an alkaline solution, the surface flatness of a semiconductor layer also is decreased due to the local irregularities in a current or light irradiation. Such a decrease in the surface flatness of a semiconductor layer decreases the crystallinity of another Group III nitride semiconductor grown on an epitaxial substrate, which degrades the physical and electrical characteristics of a semiconductor device.

SUMMARY OF THE INVENTION

Therefore, with the foregoing in mind, it is an object of the present invention to provide a method for producing a semiconductor device with high performance and reliability.

In order to achieve the above-mentioned object, the first method for producing a semiconductor device of the present invention includes: (i) heating a first semiconductor layer made of a Group III nitride-based compound semiconductor in gas containing nitrogen atoms; and (ii) after the process (i), growing a second semiconductor layer made of a Group III nitride-based compound semiconductor on the first semiconductor layer. According to the first method, an oxide layer and impurities adhering to the surface of the first semiconductor layer can be removed without degrading the flatness of the surface of the first semiconductor layer. Therefore, according to the first method, the second semiconductor layer with good crystallinity can be grown, whereby a semiconductor device with high performance and reliability can be produced.

According to the first method, the gas may contain at least one selected from the group consisting of nitrogen gas, ammonia, hydrazine, and a hydrazine derivative.

According to the first method, the first semiconductor layer may be heated at a temperature in a range of 500° C. to 1000° C. in the process (i).

Further, the second method for producing a semiconductor device of the present invention includes: (a) soaking a first semiconductor layer made of a Group III nitride-based compound semiconductor in an alkaline aqueous solution under a condition that, a current is not flowing through the first semiconductor layer; and (b) after the process (a), growing a second semiconductor layer made of a Group III nitride-based compound semiconductor on the first semiconductor layer. According to the second method, an oxide layer and impurities adhering to the surface of the first semiconductor layer can be removed without degrading the flatness of the surface of the first semiconductor layer. Therefore, according to the second method, the second semiconductor layer with good crystallinity can be grown, whereby a semiconductor device with high performance and reliability can be produced.

The second method further may include, after the process (a) and before the process (b), a heating process of heating the first semiconductor layer in gas containing nitrogen atoms. According to this structure, an oxide layer and moisture adhering to the surface of the first semiconductor layer during the process (a) can be removed, so that the second semiconductor layer with particularly good crystallinity can be formed.

According to the second method, the gas may contain at least one selected from the group consisting of nitrogen gas, ammonia, hydrazine, and a hydrazine derivative.

According to the second method, the first semiconductor layer may be heated at a temperature in a range of 500° C. to 1000° C. in the heating process.

This and other advantages of the present invention will become apparent to those skilled in the art upon reading and understanding the following detailed description with reference to the accompanying figures.

DESCRIPTION OF THE PREFERRED EMBODIMENTS

Figure 3A:
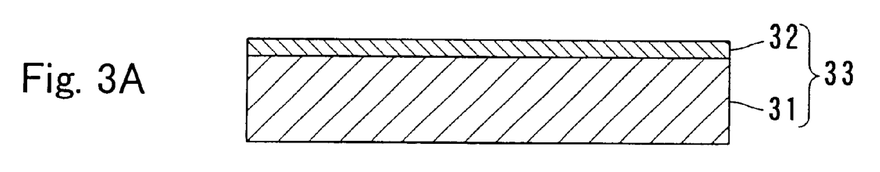
FIGS. 3A to 3C are cross-sectional views showing still another example of production processes in a method of the present invention.
Figure 3B:
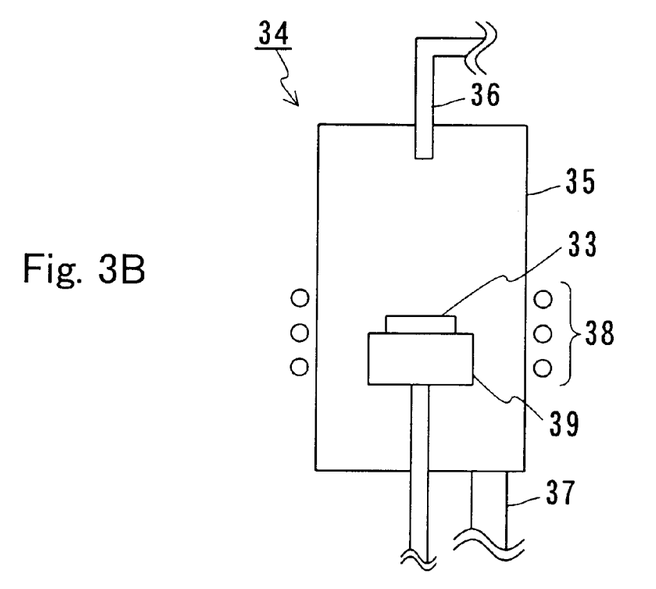
Figure 3C:
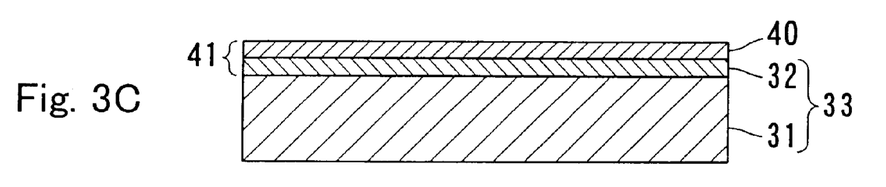

Hereinafter, the present invention will be described by way of illustrative embodiments with reference to the drawings. In the following description, a reaction apparatus will be omitted in the drawings except for FIG. 3.

Embodiment 1

Figure 1A:
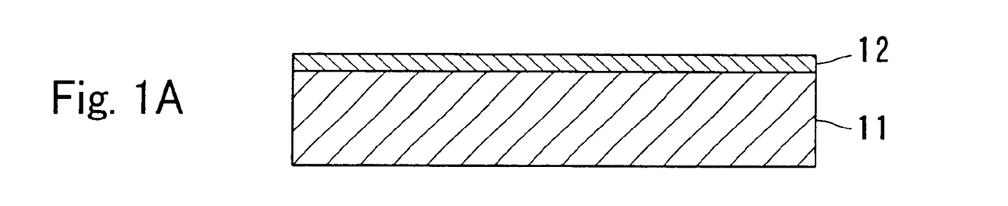
FIGS. 1A and 1B are cross-sectional views showing an example of production processes in a method of the present invention for producing a semiconductor device.
Figure 1B:
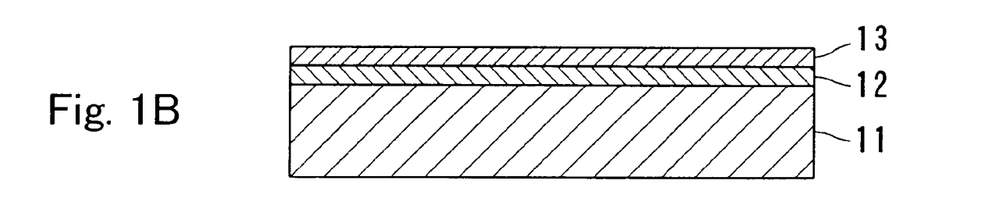

In Embodiment 1, an example of a method for producing a semiconductor device of the present invention will be described. FIGS. 1A and 1B show production processes in the method for producing a semiconductor device in Embodiment 1.

According to the method of Embodiment 1, first as shown in FIG. 1A, a first semiconductor layer 12 made of a Group III nitride-based compound semiconductor is grown on a substrate 11. The first semiconductor layer 12 can be formed, for example, by metalorganic vapor phase epitaxy (MOVPE), hydride vapor phase epitaxy (HVPE), or molecular beam epitaxy (MBE). The first semiconductor layer 12 is formed in a reaction apparatus such as an MOVPE apparatus, an HVPE apparatus, or an MBE apparatus.

As the substrate 11, a sapphire substrate or a substrate made of a Group III nitride-based compound semiconductor can be used.

The first semiconductor layer 12 is made of a Group III nitride-based compound semiconductor, i.e., a Group III–V compound semiconductor containing nitrogen as a Group V element. As the Group III element, at least one element selected from the group consisting of Ga, Al, and In can be used. Further, the first semiconductor layer 12 may contain arsenic or phosphorus in addition to nitrogen, as the Group V element. More specifically, as a material for the first semiconductor layer 12, a semiconductor represented by $Ga_xIn_yAl_{1-X-Y}N$ ($0 \leq X \leq 1$, $0 \leq Y \leq 1$, $X+Y \leq 1$) can be used. The first semiconductor layer 12 may contain a dopant. Further, another semiconductor layer made of a Group III nitride-based compound semiconductor may be formed between the substrate 11 and the first semiconductor layer 12.

Thereafter, the substrate 11 with the first semiconductor layer 12 formed thereon is taken out of the reaction apparatus, and the substrate 11 is removed and the semiconductor layer 12 is processed. For example, as described in examples later, the first semiconductor layer 12 and a current confinement layer are formed continuously in the reaction apparatus; then, the substrate 11 is taken out of the reaction apparatus, and the current confinement layer is processed. At this time, an oxide layer and impurities adhere to the surface of the first semiconductor layer 12.

Thereafter, the first semiconductor layer 12 is heated in gas containing nitrogen atoms (Process (i)). During this process, an oxide layer and impurities adhering to the surface of the first semiconductor layer 12 are removed. Process (i) can be conducted by placing the first semiconductor layer 12 in the reaction apparatus, and introducing gas containing nitrogen atoms into the reaction apparatus while heating the substrate 11. More specifically, an MOVPE apparatus, an HVPE apparatus, or an MBE apparatus can be used.

Examples of the gas containing nitrogen atoms include gas containing at least one selected from the group consisting of nitrogen gas, ammonia, hydrazine, and a hydrazine derivative. An example of the hydrazine derivative includes dimethylhydrazine.

In the above-mentioned Process (i), it is preferable to heat the first semiconductor layer 12 at a temperature in a range of 500° C. to 1000° C. In particular, in the case of heating the first semiconductor layer 12 in an atmosphere containing hydrazine, hydrogen is generated due to the decomposition of hydrazine, and impurities become likely to be removed even at a relatively low temperature. Therefore, it is preferable to heat the first semiconductor layer 12 at a temperature in a range of 500° C. to 900° C. Further, in the case of heating the first semiconductor layer 12 in an atmosphere containing nitrogen gas, it is preferable to heat it at a temperature in a range of 600° C. to 1000° C. Further, in the case of heating the first semiconductor layer 12 in an atmosphere containing ammonia, it is preferable to heat it at a temperature in a range of 600° C. to 900° C.

Next, as shown in FIG. 1B, a second semiconductor layer 13 made of a Group III nitride-based compound semiconductor is grown on the first semiconductor layer 12 (Process (ii)). Process (ii) is conducted without exposing the first semiconductor layer 12 processed in Process (i) to the air. More specifically, after Process (i) is conducted in the reaction apparatus, Process (ii) should be conducted in the same reaction apparatus.

The second semiconductor layer 13 can be formed by a method similar to that of the first semiconductor layer 12. The second semiconductor layer 13 is made of a Group III nitride-based compound semiconductor, i.e., a Group III–V compound semiconductor containing nitrogen as a Group V element. As the Group III element, at least one selected from the group consisting of Ga, Al, and In can be used. Further, the second semiconductor layer 13 may contain arsenic or phosphorus in addition to nitrogen, as the Group V element. More specifically, as a material for the second semiconductor layer 13, a semiconductor represented by $Ga_X In_Y Al_{1-X-Y}N$ ($0 \leq X \leq 1$, $0 \leq Y \leq 1$, $X+Y \leq 1$) can be used in the same way as in the first semiconductor layer 12. The second semiconductor layer 13 may be made of the same semiconductor as that of the first semiconductor layer 12, or may be made of a semiconductor different from that of the first semiconductor layer 12. Further, the second semiconductor layer 13 may contain a dopant.

The method for producing a semiconductor device in Embodiment 1 includes not only the above-mentioned production processes but also other production processes as described in examples, in accordance with a semiconductor device to be produced. According to the method of Embodiment 1, an oxide layer and impurities adhering to the surface of the first semiconductor layer 12 are removed without etching it excessively. Further, according to the method of Embodiment 1, heat treatment is conducted in an atmosphere containing nitrogen atoms, so that nitrogen can be prevented from leaving from the surface of the first semiconductor layer 12 during heat treatment. Consequently, according to the method of Embodiment 1, the second semiconductor layer 13 with good crystallinity can be formed on the first semiconductor layer 12 exposed to the air.

Embodiment 2

In Embodiment 2, another example of a method for producing a semiconductor device of the present invention will be described. The same components as those described in Embodiment 1 are denoted by the same reference numerals as those therein, and the description of the overlapping components will be omitted here.

Figure 2A:
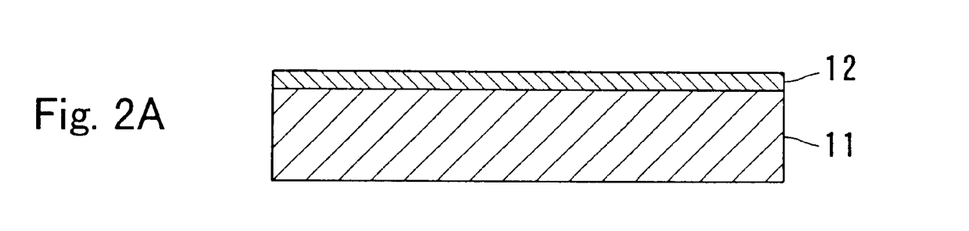
FIGS. 2A to 2C are cross-sectional views showing another example of production processes in a method of the present invention.

FIGS. 2A to 2C show production processes in the method of Embodiment 2. According to the method of Embodiment 2, first as shown in FIG. 2A, a first semiconductor layer 12 made of a Group III nitride-based compound semiconductor is grown on a substrate 11. The first semiconductor layer 12 can be formed in a reaction apparatus by the method as described in Embodiment 1. The first semiconductor layer 12 may contain a dopant. Further, another semiconductor layer made of a Group III nitride-based compound semiconductor may be formed between the substrate 11 and the first semiconductor layer 12.

Thereafter, the substrate 11 with the first semiconductor layer 12 formed thereon is taken out of the reaction apparatus and processed for the same reason as that in Embodiment 1.

Figure 2B:
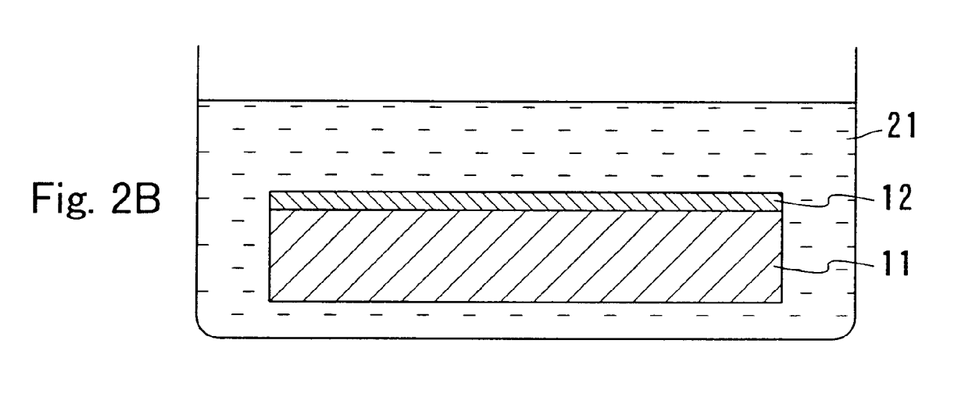

Thereafter, as shown in FIG. 2B, the first semiconductor layer 12 is soaked in an alkaline aqueous solution 21 under the condition that a current is not flowing through the first semiconductor layer 12 (Process (a)). More specifically, the first semiconductor layer 12 is soaked in the solution under the condition that light having energy with a forbidden band width or larger of the first semiconductor layer 12 is not radiated to the first semiconductor layer 12. Examples of the alkaline aqueous solution include a potassium hydroxide aqueous solution, a sodium hydroxide aqueous solution, or an ammonia aqueous solution. A preferable pH value is varied depending upon the material of the first semiconductor layer 12 and the processing conditions. However, an alkaline aqueous solution, for example, with a pH value of about 9 to 13 can be used. Further, it is preferable that the temperature of the alkaline aqueous solution is in a range of 20° C. to 130° C. The time for soaking the first semiconductor layer 12 in the alkaline aqueous solution is varied depending upon the pH thereof. It may be 1 to 10 minutes, for example. Because of Process (a), an oxide layer and impurities adhering to the surface of the first semiconductor layer 12 can be removed without etching the first semiconductor layer 12 excessively.

After Process (a), the first semiconductor layer 12 is heated in gas containing nitrogen atoms (heating process). This heating process can be conducted in a reaction apparatus by the same method as that in Process (i) described in Embodiment 1. However, in this heating process, since a thin oxide layer formed after Process (a) on the surface of the first semiconductor layer 12 merely is removed, the heating temperature should be lower than that in Process (i). More specifically, it is preferable that the first semiconductor layer 12 is heated at a temperature in a range of 500° C. to 1000° C., and more preferably at a temperature in a range of 600° to 900° C. The heating process may be omitted.

Figure 2C:
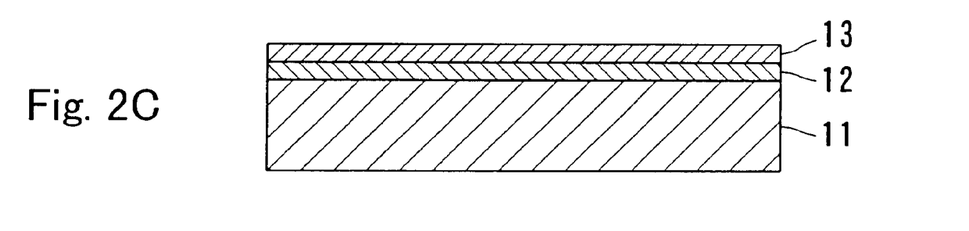

Next, a second semiconductor layer 13 made of a Group III nitride-based compound semiconductor is grown on the first semiconductor layer 12 (Process (b)). Process (b) is conducted without exposing the second semiconductor layer 13 to the air after the heating process. More specifically, after conducting the heating process in the reaction apparatus, the process (b) should be conducted in the same apparatus.

The second semiconductor layer 13 can be formed by the method as described in Embodiment 1. The second semiconductor layer 13 may be made of the same semiconductor as that of the first semiconductor layer 12, or may be made of a semiconductor different from that of the first semiconductor layer 12. The second semiconductor layer 13 may contain a dopant.

The method for producing a semiconductor device in Embodiment 2 includes not only the above-mentioned production processes but also other production processes as described in examples, in accordance with a semiconductor device to be produced. According to the method of Embodiment 2, an oxide layer and impurities adhering to the surface of the first semiconductor layer 12 are removed without etching it excessively. Therefore, the second semiconductor layer 13 with good crystallinity can be formed on the first semiconductor layer 12 exposed to the air. In particular, according to the method of Embodiment 2, a heat treatment temperature in the heating process may be lower, so that the first semiconductor layer 12 is less influenced, and the second semiconductor layer 13 with particularly good crystallinity can be formed.

EXAMPLES

Hereinafter, the present invention will be described in more detail by way of illustrative examples.

Example 1

In Example 1, an example will be described in which a pn junction is formed by the method of Embodiment 1.

First, as shown in FIG. 3A, an n-GaN layer (n-type GaN layer) 32 was grown on a sapphire substrate 31 in a reaction apparatus. Hereinafter, the sapphire substrate 31 and the n-GaN layer 32 may be referred to as a substrate 33 collectively.

Next, the substrate 33 was taken out of the reaction apparatus, and washed with an organic solvent for removal of dust and degreasing. Thereafter, as shown in FIG. 3B, the substrate 33 was placed in an MOVPE apparatus 34. The MOVPE apparatus 34 includes a chamber 35, a gas induction line 36 and an exhaust line 37 connected to the chamber 35, a high-frequency coil disposed on the periphery of the chamber 35, and a substrate stage 39 disposed in the chamber 35. Then, an oxide layer and impurities adhering to the surface of the n-GaN layer 32 were removed by heating the substrate 33 in the MOVPE apparatus 34. This heat treatment was conducted at a substrate temperature of 800° C. for 5 minutes. Further, the heat treatment was conducted in the MOVPE apparatus 34 containing mixed gas (hydrogen gas:ammonia=15:4 (ratio of flow rate)) of 1.01× $10^5$ Pa (1 atmospheric pressure). More specifically, the flow rates of hydrogen gas and ammonia were set at 15 slm and 4 slm, respectively. Here, "slm" denotes a unit of a flow rate, and "1 slm" means that 1 L of gas in a standard state is allowed to flow for one minute.

After the heat treatment, the temperature of the substrate 33 was set at 1000° C., and a p-GaN layer (p-type GaN layer) 40 was grown on the n-GaN layer 32 in the MOVPE apparatus 34 by using an MOVPE method, as shown in FIG. 3C. In FIG. 3C, the MOVPE apparatus 34 is not shown. Thus, a pn junction 41 composed of the n-GaN layer 32 and the p-GaN layer 40 was formed.

On the other hand, for comparison, a pn junction (hereinafter, referred to as a "pn junction in the comparative example") was produced by the same method as that in Example 1 except that the heat treatment was conducted in an atmosphere of only hydrogen gas.

Figure 4A:
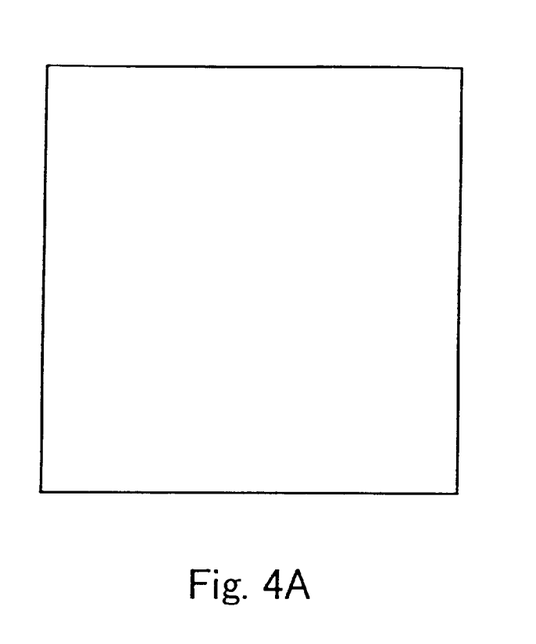
FIG. 4A is a schematic view showing an exemplary surface state of a pn junction produced by a method of the present invention.
Figure 4B:
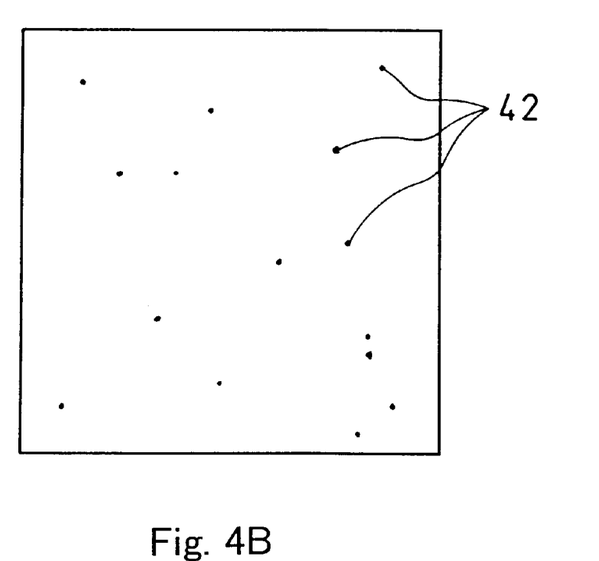
FIG. 4B is a schematic view showing an exemplary surface state of a pn junction produced by a method for producing a semiconductor device in a comparative example.

Regarding the pn junctions in Example 1 and the comparative example, the surface of the p-GaN layer was observed with an optical microscope. At this time, the surface of the p-GaN layer was evaluated by photography under 1000-fold magnification with an optical microscope. FIG. 4A schematically shows the observation results of the p-GaN layer 40 of the pn junction 41, and FIG. 4B schematically shows the observation results of the p-GaN layer in the comparative example.

As shown in FIG. 4A, the p-GaN layer 40 had a mirror surface with little unevenness. It is considered that this is because the n-GaN layer 32 had a mirror surface with little unevenness. On the other hand, as shown in FIG. 4B, pits 42 of several μm were formed on the surface of the p-GaN layer 40 of the pn junction in the comparative example. It is considered that this is because GaN in the surface of the n-GaN layer was decomposed by heat treatment in a hydrogen atmosphere, and the flatness of the surface of the n-GaN layer was degraded. From this, it was found that decomposition of the first semiconductor layer (n-GaN layer) by heat treatment was suppressed, and the second semiconductor layer (p-GaN layer) with good crystallinity having a mirror surface was allowed to be formed, by conducting the heat treatment in an atmosphere containing nitrogen.

Further, the pn junction 41 in Example 1 and the pn junction in the comparative example were evaluated by secondary ion mass spectroscopy (SIMS). Consequently, the concentrations of carbon and oxygen atoms present at the interface of the pn junction 41 (interface between the n-GaN layer 32 and the p-GaN layer 40) were $2\times10^{18}/cm^3$ and $2\times10^{17}/cm^3$, respectively. On the other hand, the concentrations of carbon and oxygen atoms present at the interface of the pn junction in the comparative example were $1\times10^{19}/cm^3$ and $6\times10^{18}/cm^3$, respectively. From this, it was found that an oxide layer and impurities adhering to the surface of the n-GaN layer 32 were effectively removed by conducting heat treatment in an ammonia atmosphere, according to the method of Example 1.

Figure 5:
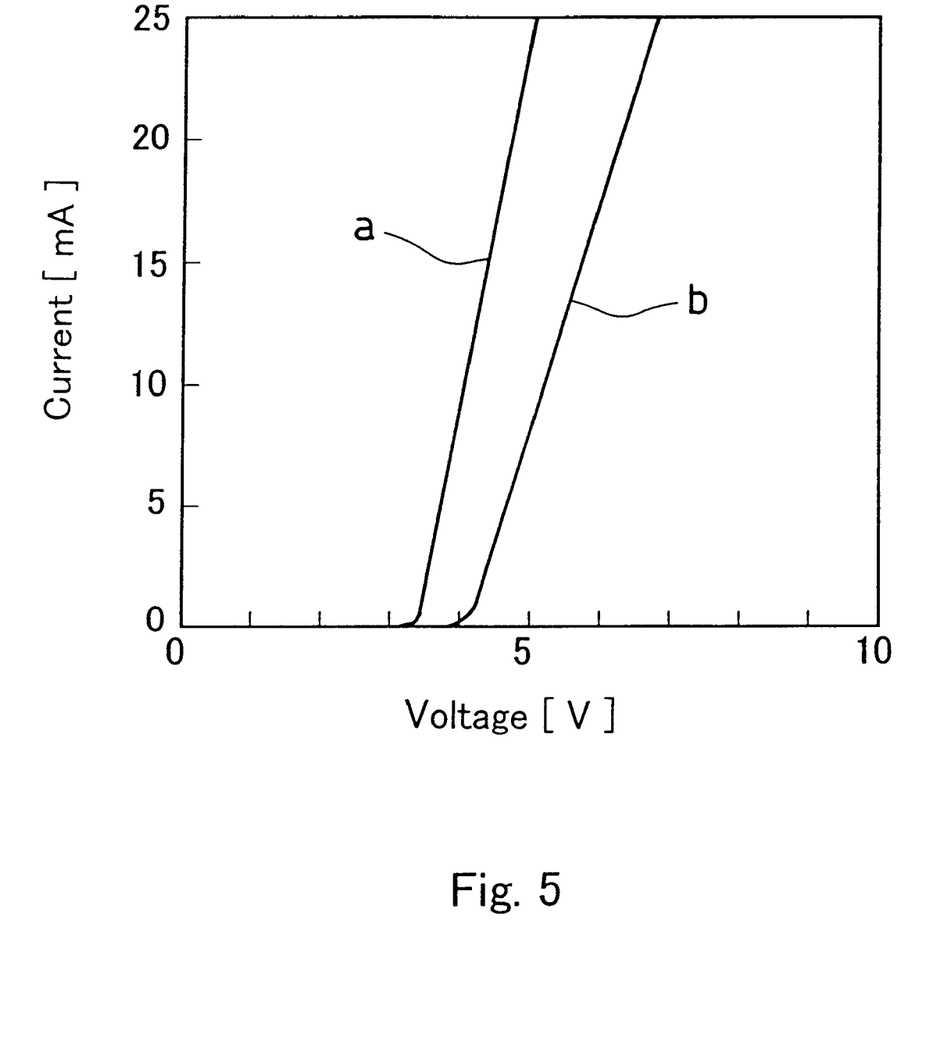
FIG. 5 is a graph showing an example of current-voltage characteristics with respect to a pn junction produced by a method of the present invention and a pn junction produced by a method for producing a semiconductor device in a comparative example.

Next, the pn junction 41 in Example 1 and the pn junction in the comparative example were measured for current-voltage characteristics. FIG. 5 shows current-voltage characteristics (line a) of the pn junction 41 and current-voltage characteristics (line b) of the pn junction in the comparative example. As shown in FIG. 5, a rise voltage of the pn junction 41 was 3.4 volts, whereas a rise voltage of the pn junction in the comparative example was 4.1 volts. From this, it was found that a satisfactory pn junction was formed by heat treatment in Example 1, which was not realized by the conventional surface treatment. It is considered that this is because the surface of the first semiconductor layer (n-GaN layer) was effectively cleaned.

Further, the pn junction 41 in Example 1 and the pn junction in the comparative example were measured for a specific resistance of the p-GaN layer. As a result, the specific resistance of the p-GaN layer in the comparative example was 0.3 Ω·cm, whereas that of the p-GaN layer 40 was 1.0 Ω·cm. From this, it was found that the second semiconductor layer (p-GaN layer) with good crystallinity was formed by subjecting the substrate 33 to heat treatment in an ammonia atmosphere.

Example 2

In Example 2, the case will be described in which a pn junction was formed by the same method as that in Example 1 except that the heating temperature in the heat treatment was changed In the heat treatment in Example 2, the heating time was set at 5 minutes as in Example 1. Further, as in Example 1, a gas atmosphere during heat treatment was prescribed to be a mixed gas atmosphere of ammonia and hydrogen gas (flow rate of ammonia was set at 4 slm, and that of hydrogen gas was set at 15 slm). The pressure of the mixed gas was set at $1.01\times10^5$ Pa (1 atmospheric pressure). Then, a plurality of pn junctions were formed while varying the temperature of the substrate 33 at a time of heat treatment in a range of 400° C. to 1000° C.

With respect to the respective pn junctions, the surface of the p-GaN layer was observed with an optical microscope, and the unevenness of the surface of the p-GaN layer was measured. Further, the concentrations of carbon and oxygen atoms at the junction interface were measured. Table 1 shows the measurement results.

TABLE 1

| Substrate temperature (° C.) | Surface state of a p-GaN layer | | Impurity concentration (cm$^{-3}$) | |
|---|---|---|---|---|
| | Surface | Unevenness (RMS, nm) | Carbon | Oxygen |
| 400 | Rough | 15 | $2 \times 10^{19}$ | $8 \times 10^{18}$ |
| 450 | Rough | 12 | $1 \times 10^{19}$ | $6 \times 10^{18}$ |
| 500 | Not rough | 11 | $6 \times 10^{18}$ | $3 \times 10^{18}$ |
| 600 | Not rough | 5 | $3 \times 10^{18}$ | $9 \times 10^{17}$ |
| 700 | Not rough | 3 | $2 \times 10^{18}$ | $3 \times 10^{17}$ |
| 800 | Not rough | 2 | $2 \times 10^{18}$ | $2 \times 10^{17}$ |
| 900 | Not rough | 4 | $5 \times 10^{17}$ | $1 \times 10^{17}$ |
| 950 | Rough | 11 | $1 \times 10^{17}$ | $5 \times 10^{16}$ |
| 1000 | Rough | 28 | $2 \times 10^{16}$ | $1 \times 10^{16}$ |

In Table 1, the value of unevenness is an RMS (root mean square) value evaluated by an AFM (atomic force microscope). In the samples obtained by setting the substrate temperature at 400° C., 450° C., 950° C., and 1000° C., unevenness was measured selecting a portion of the surface of the p-GaN layer where there was no roughness.

Figure 6A:
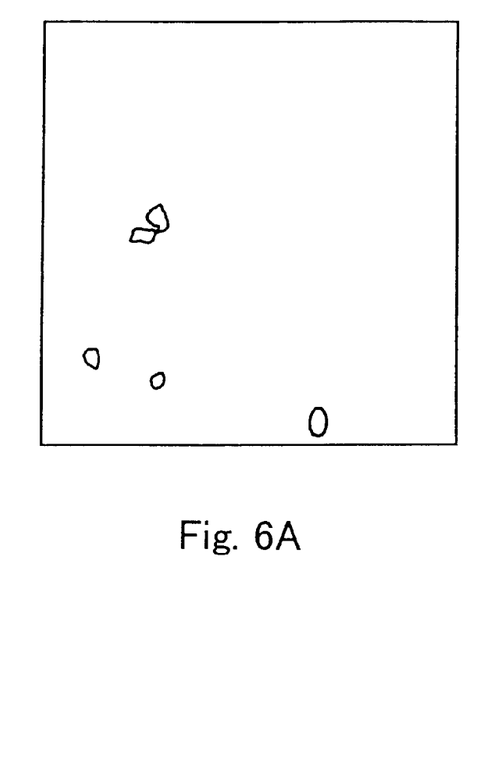
FIGS. 6A and 6B are schematic views showing exemplary surface states of a pn junction produced by a method of the present invention at a heat treatment temperature of 450° C. and 950° C., respectively.
Figure 6B:
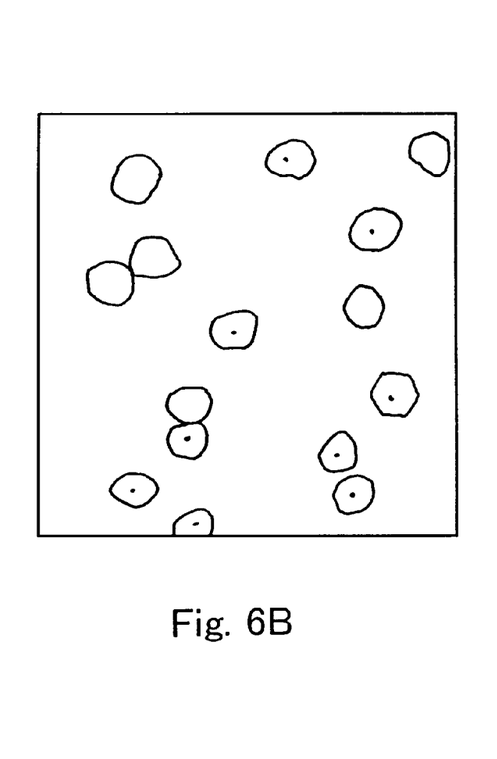

Further, FIGS. 6A and 6B show results of observing the surface of the p-GaN layer with an optical microscope, when the heat treatment temperature was set at 450° C. and 950° C., respectively. The observation with an optical microscope was conducted by setting the magnification at 1000 times.

It was found from Table 1 that in the case where the heat treatment temperature was in a range of 500° C. to 900° C., surface roughness was not recognized. Further, it was found from FIGS. 6A and 6B that in the case where the heat treatment temperature was 450° C. or 950° C., the surface of the p-GaN layer was rough. The reason for this is considered as follows. When the heat treatment temperature becomes less than 500° C., an oxide layer and impurities adhering to the surface of the n-GaN layer become unlikely to be removed, whereby the surface of the n-GaN layer becomes dirty, and the surface of the p-GaN layer to be grown thereon becomes rough. Further, when the heat treatment temperature becomes 950° C. or higher, nitrogen leaves from the surface of the n-GaN layer, whereby the surface of the n-GaN layer becomes rough, and consequently, the surface of the p-GaN layer to be grown thereon becomes rough. Therefore, it is preferable that the heat treatment is conducted in a range of 500° C. to 900° C.

In Examples 1 and 2, a gas atmosphere of heat treatment was prescribed to be a mixed gas atmosphere of ammonia and hydrogen; however, any atmosphere may be used as long as it contains nitrogen atoms. For example, the same effects will be obtained even when heat treatment is conducted in a nitrogen gas atmosphere, a hydrazine atmosphere, a dimethylhydrazine atmosphere, or an ammonia atmosphere.

Example 3

In Example 3, the case will be described with reference to FIGS. 7A to 7C in which a semiconductor laser with a current confinement layer was produced by the method of Embodiment 1.

First, an n-GaN substrate 71 was prepared. The substrate 71 was produced by growing an n-GaN layer on a sapphire substrate, and removing the sapphire substrate by polishing. Then, the surface of the substrate 71 was cleaned under the same conditions as those in Example 1. More specifically, the substrate 71 was subjected to heat treatment in an atmosphere of mixed gas (ammonia and hydrogen gas) in an MOVPE apparatus.

Figure 7A:
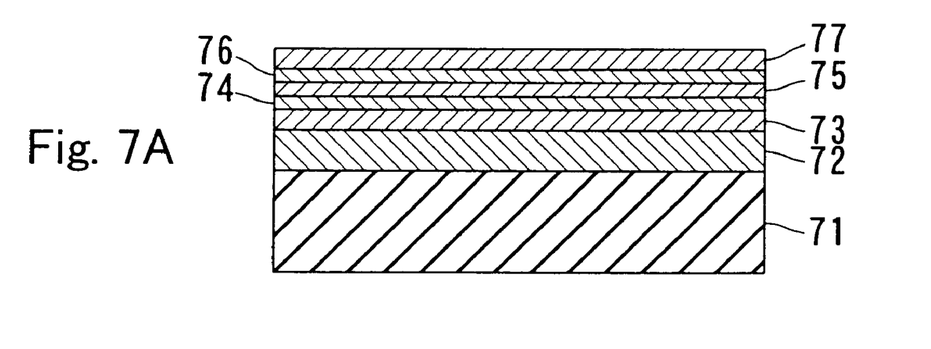
FIGS. 7A to 7C are cross-sectional views showing still another example of production processes in a method of the present invention.

After the heat treatment, as shown in FIG. 7A, a cladding layer 72 (thickness: 1 μm) made of n-type AlGaN, a light guide layer 73 (thickness: 0.3 μm) made of n-type GaN, an active layer 74 made of InGaN, a light guide layer 75 (thickness: 0.05 μm) made of p-type GaN, a first p-AlGaN cladding layer 76 (thickness: 0.05 μm) made of p-type AlGaN, and a current confinement layer 77 (thickness: 0.5 μm) made of n-type AlGaN were formed on the substrate 71 successively by an MOVPE method. The atomic ratio between Al and Ga in the cladding layer 72 was set at 10:90. The active layer 74 has a multi-quantum well structure. More specifically, the active layer 74 is composed of a barrier layer (thickness: 3 nm, not shown) made of InGaN, and a well layer (thickness: 6 nm, not shown) made of InGaN. The atomic ratio between In and Ga in the barrier layer was set at 3:97, and the atomic ratio between In and Ga in the well layer was set at 15:85.

Figure 7B:
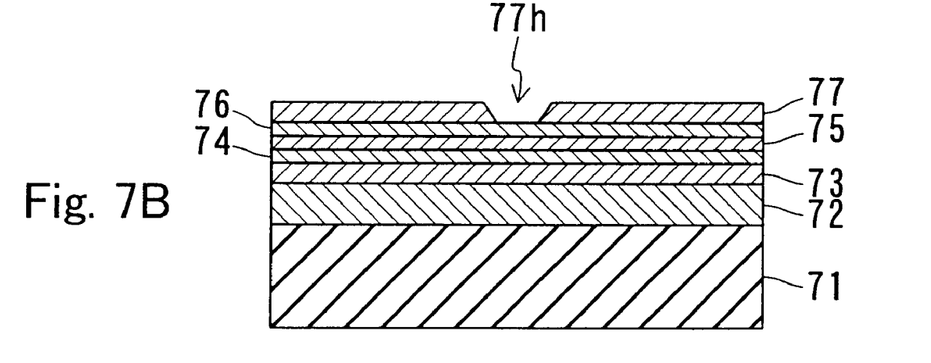

Next, the substrate 71 was taken out of the MOVPE apparatus, and an opening 77h in a stripe shape (width: 2 μm) was formed in the current confinement layer 77 by etching, as shown in FIG. 7B.

Then, the substrate 71 was placed in the MOVPE apparatus again, and heat treatment was conducted under the same conditions as those in Example 1, whereby the surfaces of the first p-AlGaN cladding layer 76 and the current confinement layer 77 were cleaned.

Figure 7C:
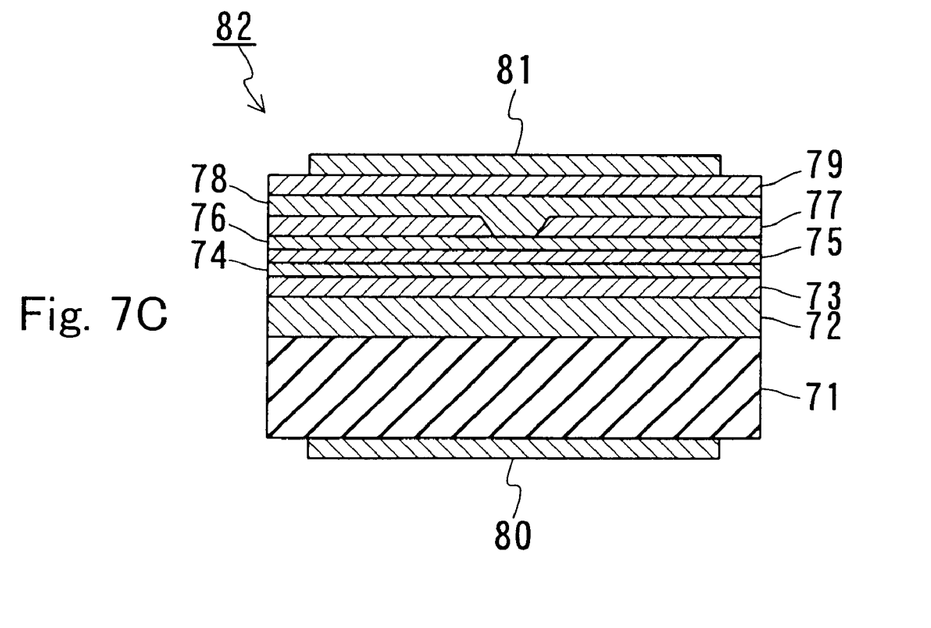

Next, as shown in FIG. 7C, a second p-AlGaN cladding layer 78 (thickness: 1 μm) made of p-type AlGaN and a contact layer 79 (thickness: 0.1 μm) made of p-type GaN were formed successively on the first p-AlGaN cladding layer 76 and the current confinement layer 77 by an MOVPE method. The atomic ratio between Al and Ga in the second p-AlGaN cladding layer 78 was set at 10:90.

Finally, as shown in FIG. 7C, an n-side electrode 80 was formed on the back surface of the substrate 71, and a p-side electrode 81 was formed on the contact layer 79, whereby a semiconductor laser (semiconductor device) 82 was produced.

On the other hand, as a comparative example, a semiconductor laser was produced under the same conditions as those in the semiconductor laser 82 except that the current confinement layer 77 was subjected to heat treatment in an atmosphere of only hydrogen gas. Hereinafter, this semiconductor laser will be referred to as a semiconductor laser in the comparative example.

Figure 8:
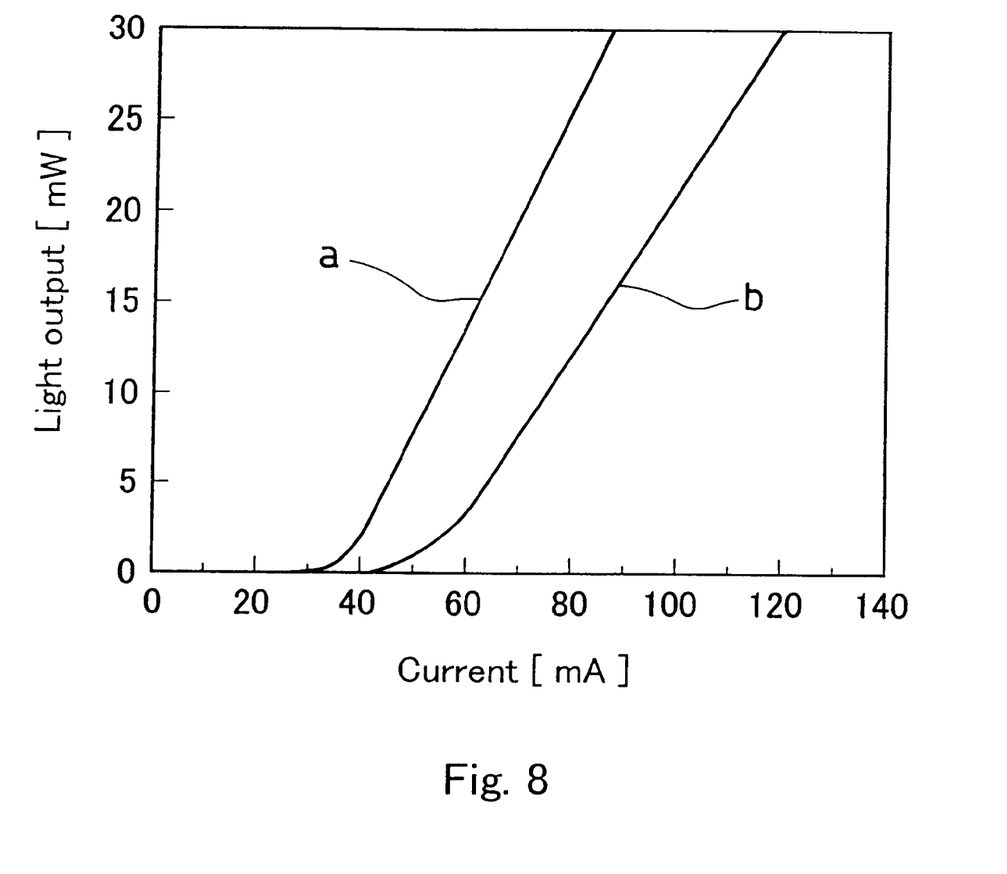
FIG. 8 is a graph showing exemplary current-light output characteristics with respect to a semiconductor laser produced by a method of the present invention and a semiconductor laser in a comparative example.

FIG. 8 shows current-light output characteristics (line a) of the semiconductor laser 82 and current-light output characteristics (line b) of the semiconductor laser in the comparative example. It is understood from FIG. 8 that a threshold current and a working current of the semiconductor laser 82 were smaller than those of the semiconductor laser in the comparative example. It is considered that this is because the surface of the first p-AlGaN cladding layer 76 was cleaned sufficiently by heat treatment described in Example 1, so that the second p-AlGaN cladding layer 78 with good crystallinity was formed; as a result, an electrical resistance and a light loss at the interface between the first p-AlGaN cladding layer 76 and the second p-AlGaN cladding layer 77 were reduced.

A durability test was conducted with respect to the semiconductor laser 82 and the semiconductor laser in the comparative example. The durability test was conducted by operating a plurality of semiconductor lasers at a temperature of 25° C. and a constant light output (30 mW). About half of the semiconductor lasers in the comparative example were disabled after 1000 hours from the commencement of the durability test. The remaining semiconductor lasers also were degraded considerably in device characteristics (i.e., a working current increased by 60% on average). On the other hand, all the semiconductor lasers 82 were operated even after 1000 hours from the commencement of the durability test, and a working current increased by 2% on average. Thus, the reliability of the semiconductor laser in Example 3 was enhanced remarkably.

Example 4

In Example 4, the case will be described with reference to FIGS. 9A to 9C in which a pn junction was formed by the method of Embodiment 2.

Figure 9A:
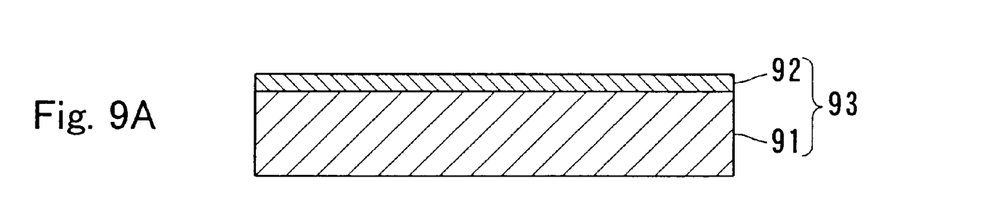
FIGS. 9A to 9C are cross-sectional views showing still another example of production processes in a method of the present invention.
Figure 9B:
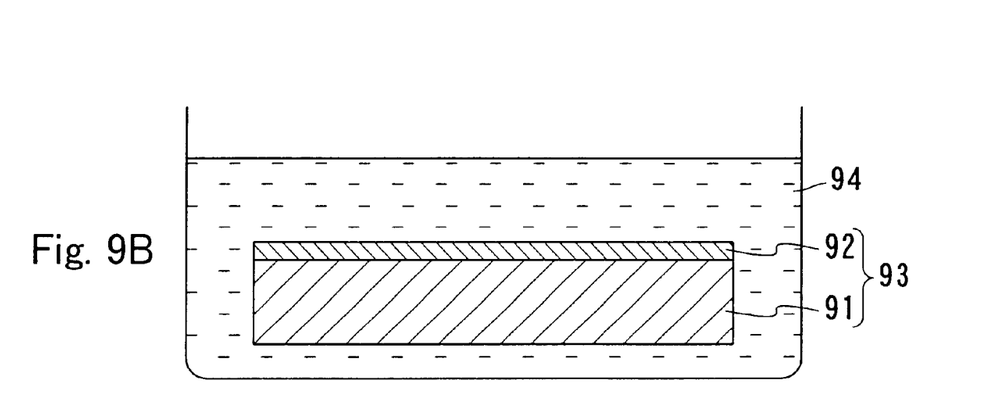
Figure 9C:
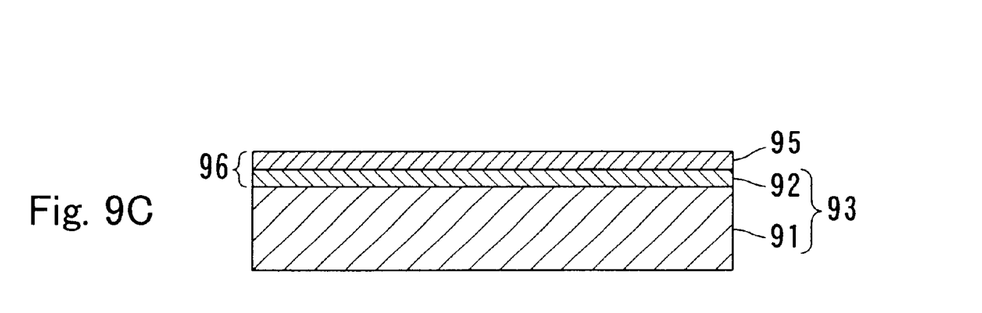

First, as shown in FIG. 9A, an n-GaN layer (n-type GaN layer) 92 was grown on a sapphire substrate 91 in a reaction apparatus. Hereinafter, the sapphire substrate 91 and the n-GaN layer 92 may be referred to as a substrate 93 collectively.

Next, the substrate 93 was taken out of the reaction apparatus, and washed with an organic solvent for removal of dust and degreasing. Thereafter, as shown in FIG. 9B, the substrate 93 was soaked in a potassium hydroxide aqueous solution 94 (pH=13, 90° C.) for 5 minutes, whereby an oxide layer and impurities adhering to the surface of the n-GaN layer 92 were removed. In this process, if a current had flowed through the n-GaN layer 92, an etching rate of the n-GaN layer 92 would have been increased, and the surface of the n-GaN layer 92 would have been roughened. So, in the process of FIG. 9B, a current was prevented from flowing through the potassium hydroxide aqueous solution 94, and light with energy larger than a forbidden band width of the n-GaN layer 92 was prevented from being radiated to the n-GaN layer 92. According to the surface treatment in FIG. 9B, a thin oxide layer and impurities adhering to the surface of the n-GaN layer 92 merely are removed, so that only a very thin layer in the vicinity of the surface of the n-GaN layer 92 should be removed.

Thereafter, the substrate 93 was placed in the MOVPE apparatus. The substrate 93 was heated to 1000° C., and a p-GaN layer (p-type GaN layer) 95 was grown on the n-GaN layer 92 by an MOVPE method, as shown in FIG. 9C, whereby a pn junction 96 was formed.

According to the method of Example 4, an oxide layer and impurities adhering to the surface of the n-GaN layer 92 were removed by using a potassium hydroxide aqueous solution. Therefore, an oxide layer and impurities can be removed efficiently while the surface of the n-GaN layer 92 was prevented from being roughened. In particular, an oxide layer is dissolved easily in a potassium hydroxide aqueous solution, so that the oxide layer on the surface of the n-GaN layer 92 can be removed efficiently. According to the method of Example 4, since the p-GaN layer 95 is grown on the n-GaN layer 92 from which an oxide layer and impurities have been removed, the p-GaN layer 95 with good crystallinity can be formed.

Further, for comparison, a pn junction in the comparative example was produced. In this comparative example, the n-GaN layer 92 was subjected to surface treatment using phosphoric acid, which has been conducted conventionally. Thereafter, a p-GaN layer was formed to produce a pn junction. The pn junction 96 and the pn junction in the comparative example also were evaluated for characteristics.

Regarding the pn junction 96, the surface of the p-GaN layer 95 was observed by photography with an optical microscope at a 1000-fold magnification. Consequently, the p-GaN layer 95 was found to have a mirror surface with little unevenness. It is considered that this is because the n-GaN layer 92 had a mirror surface with little unevenness, and the p-GaN layer 95 formed thereon also had a mirror surface.

Further, impurities at the junction interface were evaluated by secondary ion mass spectrometry (SIMS). Consequently, the concentrations of carbon and oxygen atoms at the interface of the pn junction 96 (interface between the n-GaN layer 92 and the p-GaN layer 95) were $2\times10^{18}/cm^3$ and $2\times10^{17}/cm^3$, respectively. On the other hand, the concentrations of carbon and oxygen atoms at the interface of the pn junction in the comparative example were $1\times10^{19}/cm^3$ and $6\times10^{18}/cm^3$, respectively. From this, it was found that an oxide layer and impurities adhering to the surface of the n-GaN layer 92 were removed effectively by the surface treatment in Example 4, and the surface of the n-GaN layer 92 was cleaned effectively.

Figure 10:
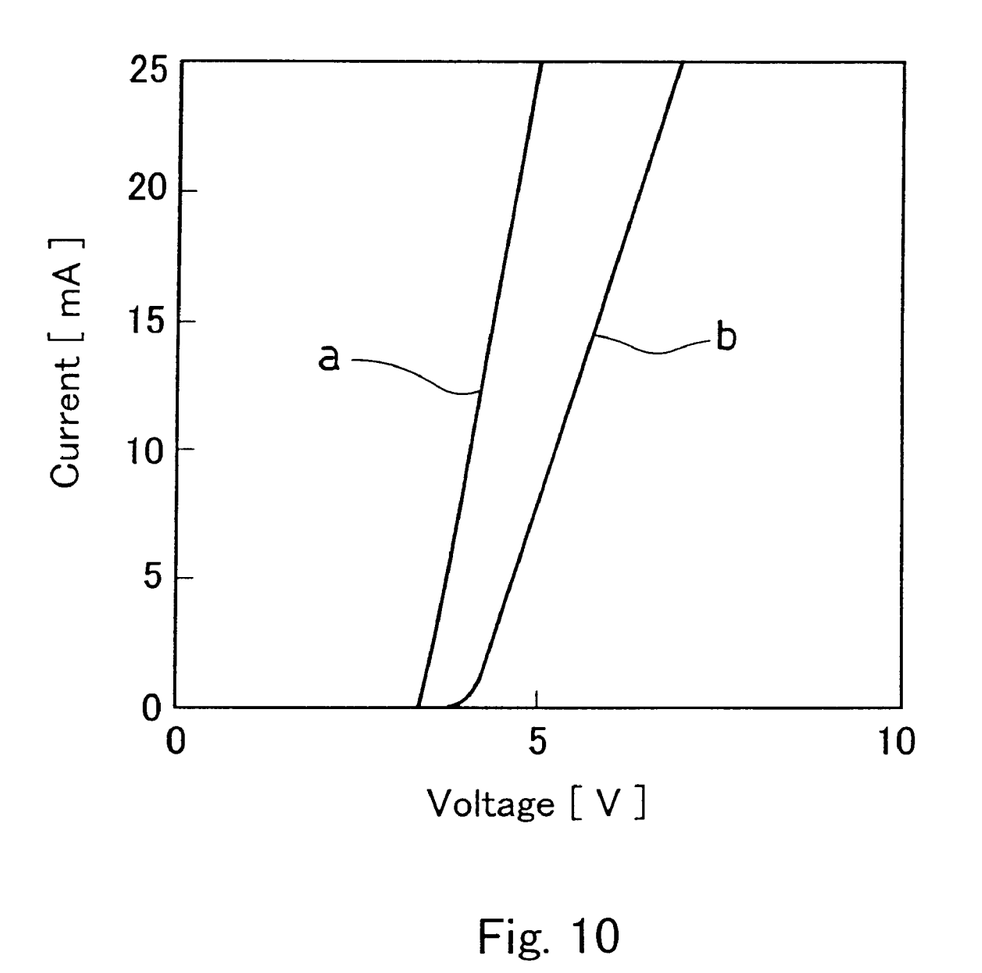
FIG. 10 is a graph showing another example of current-voltage characteristics with respect to a pn junction produced by a method of the present invention and a pn junction produced by a method for producing a semiconductor device in a comparative example.

Next, the pn junction 96 and the pn junction in the comparative example were measured for current-voltage characteristics. FIG. 10 shows current-voltage characteristics (line a) of the pn junction 96 and current voltage characteristics (line b) in the comparative example. As shown in FIG. 10, a rise voltage of the pn junction 96 was 3.4 volts, whereas a rise voltage of the pn junction in the comparative example was 4.1 volts. From this, it can be understood that a satisfactory pn junction, which was not realized by the conventional surface treatment, was formed by the method of Example 4. The reason for this is considered that the surface of the n-GaN layer 92 was cleaned effectively.

Further, the specific resistance of the p-GaN layer was measured to be 0.3 Ω·cm in the case of the pn junction in the comparative example, whereas the specific resistance of the p-GaN layer was measured to be 0.1 Ω·cm in the case of the pn junction 96. From this, it was found that the p-GaN layer 92 with good crystallinity was formed by the surface treatment in Example 4.

According to the method of Example 4, the same effects can be obtained even when a sodium hydroxide aqueous solution or an ammonia aqueous solution is used in place of potassium hydroxide aqueous solution.

Example 5

Figure 11A:
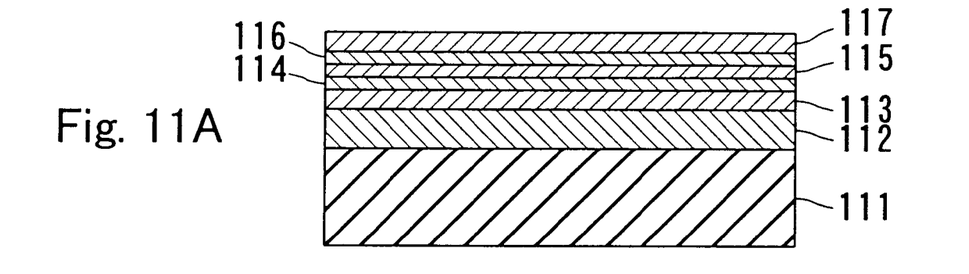
FIGS. 11A to 11C are cross-sectional views showing still another example of production processes in a method of the present invention.

In Example 5, the case will be described with reference to FIGS. 11A to 11C in which a semiconductor laser with a current confinement layer was produced by the method of Embodiment 2.

First, a substrate 111 made of n-type GaN was prepared. The substrate 111 was produced by the same method as that of the substrate 71.

Next, the substrate 111 was subjected to surface treatment using potassium hydroxide aqueous solution under the same conditions as those in Example 4. Thereafter, the substrate 111 was placed in an MOVPE apparatus, and the substrate 111 was subjected to heat treatment in an atmosphere of mixed gas (ammonia and hydrogen gas) under the same conditions as those in Example 1.

Figure 11B:
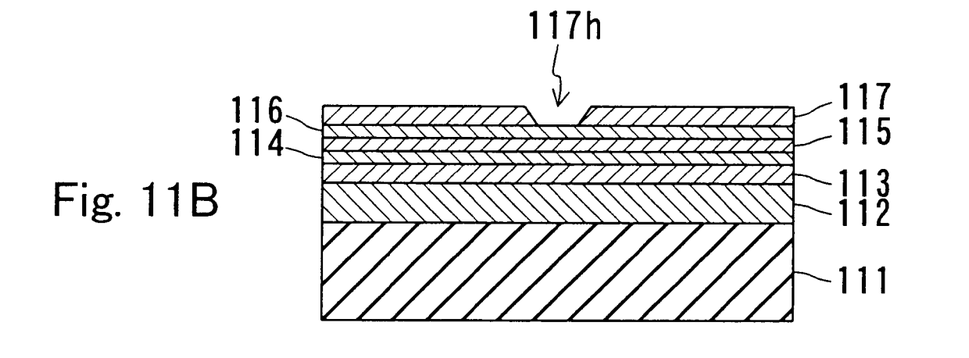

After the heat treatment, as shown in FIG. 11B, a cladding layer 112 (thickness: 1 μm) made of n-type AlGaN, a light guide layer 113 (thickness: 0.3 μm) made of n-type GaN, an active layer 114 made of InGaN, a light guide layer 115 (thickness: 0.05 μm) made of p-type GaN, a first p-AlGaN cladding layer 116 (thickness: 0.05 μm) made of p-type AlGaN, and a current confinement layer 117 (thickness: 0.5 μm) made of n-type AlGaN were formed on the substrate 111 successively by an MOVPE method. The atomic ratio between Al and Ga in the cladding layer 112 was set at 10:90. The active layer 114 had a multi-quantum well structure in the same way as in the active layer 74.

Next, the substrate 111 was taken out of the MOVPE apparatus, and an opening 117h in a stripe shape (width: 2 μm) was formed in the current confinement layer 117 by etching, as shown in FIG. 11B.

Then, the substrate 111 was subjected to surface treatment using potassium hydroxide aqueous solution under the same conditions as those in Example 4. Thereafter, the substrate 111 was placed in the MOVPE apparatus again. Then, heat treatment was conducted in an atmosphere of mixed gas (ammonia and hydrogen gas) in the MOVPE apparatus under the same conditions as those in Example 1.

Figure 11C:
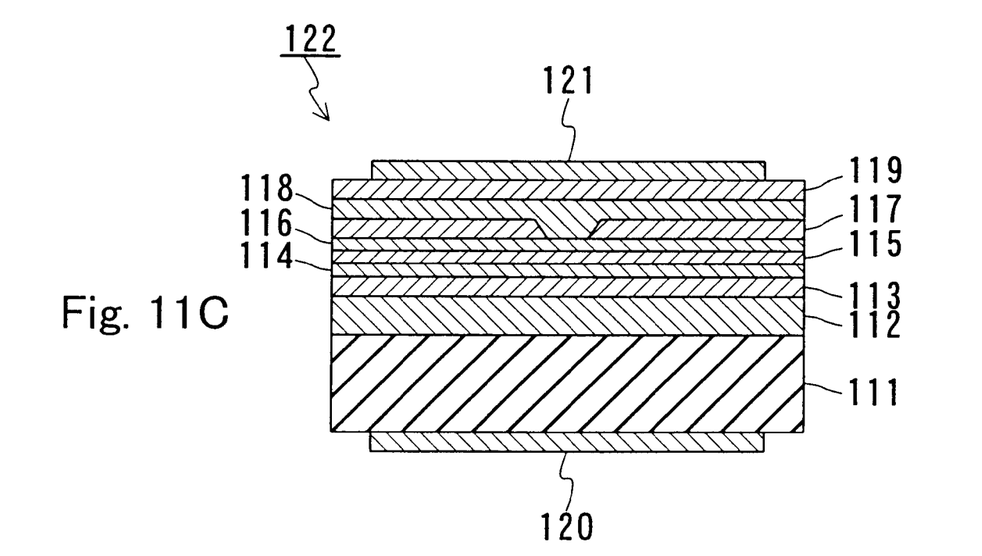

After the heat treatment, as shown in FIG. 11C, a second p-AlGaN cladding layer 118 (thickness: 1 μm) made of p-type AlGaN and a contact layer 119 (thickness: 0.1 μm) made of p-type GaN were formed successively on the first p-AlGaN cladding layer 116 and the current confinement layer 117 by an MOVPE method. The atomic ratio between Al and Ga in the p-AlGaN cladding layer 118 was set at 10:90.

Finally, as shown in FIG. 11C, an n-side electrode 120 was formed on the back surface of the substrate 111, and a p-side electrode 121 was formed on the contact layer 119, whereby a semiconductor laser (semiconductor device) 122 was produced.

On the other hand, as a comparative example, a semiconductor laser was produced under the same conditions as those in the semiconductor laser 82 except that the substrate 111 and the current confinement layer 117 were subjected to surface treatment by using phosphoric acid, which has been used conventionally. Hereinafter, this semiconductor laser will be referred to as a semiconductor laser in the comparative example.

According to the method of Example 5, the substrate 111 and the current confinement layer 117 were subjected to heat treatment in an atmosphere of mixed gas (ammonia and hydrogen gas) after the surface treatment by potassium hydroxide aqueous solution. Therefore, water molecules, which adhere to the substrate 111 and the current confinement layer 117 when they are soaked in the potassium hydroxide aqueous solution, can be removed, and the surfaces of the substrate 111 and the current confinement layer 117 can be cleaned particularly. Consequently, the crystallinity of a Group III nitride-based compound semiconductor grown on the substrate 111 can be rendered particularly satisfactory.

Figure 12:
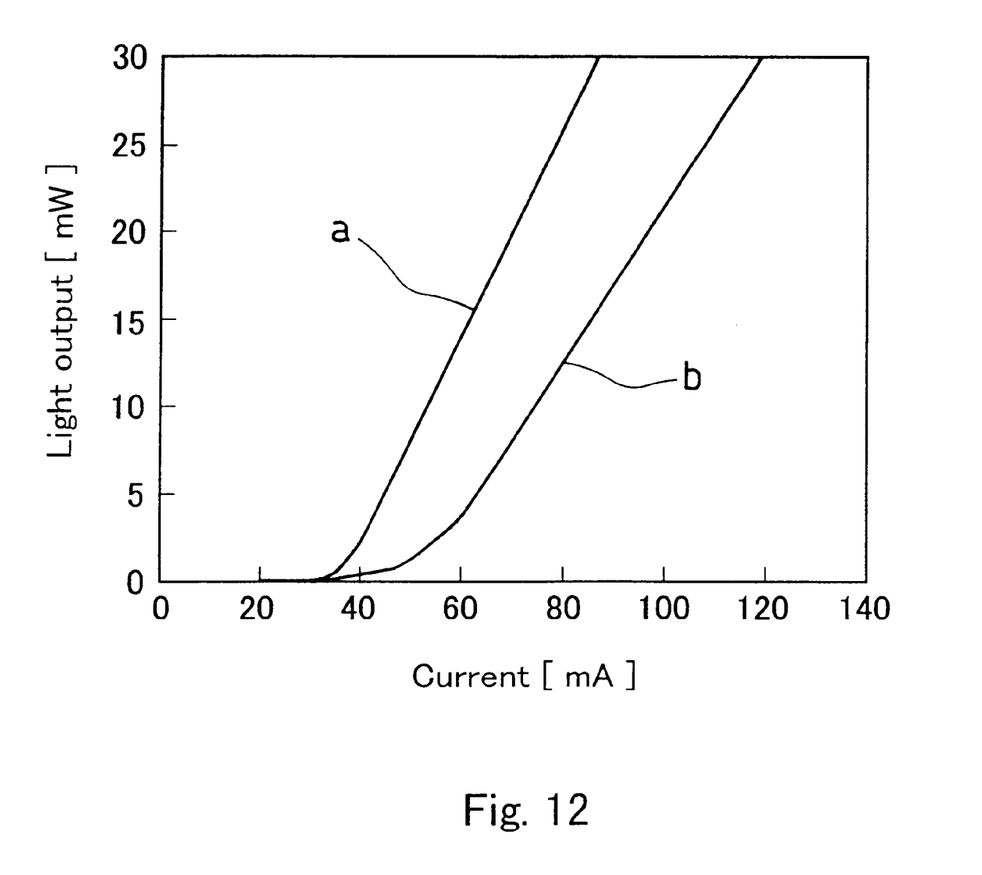
FIG. 12 is a graph showing still another example of current-light output characteristics with respect to a semiconductor laser produced by a method of the present invention and a semiconductor laser in a comparative example.

FIG. 12 shows current-light output characteristics (line a) of the semiconductor laser 122 and current-light output characteristics (line b) of the semiconductor laser in the comparative example. It is understood from FIG. 12 that a threshold current and a working current of the semiconductor laser 122 are smaller than those of the semiconductor laser in the comparative example. It is considered that this is because the surface of the first p-AlGaN cladding layer 116 was cleaned sufficiently, so that the second p-AlGaN cladding layer 118 with good crystallinity was formed; as a result, an electrical resistance and a light loss at the interface between the first p-AlGaN cladding layer 116 and the second p-AlGaN cladding layer 117 were reduced.

A durability test was conducted with respect to the semiconductor laser 122 and the semiconductor laser in the comparative example. The durability test was conducted by operating a plurality of semiconductor lasers at a temperature of 25° C. and a constant light output (30 mW). About half of the semiconductor lasers in the comparative example were disabled after 1000 hours from the commencement of the durability test. The remaining semiconductor lasers also were degraded considerably in device characteristics (i.e., a working current increased by 60% on average). On the other hand, all the semiconductor lasers 122 were operational even after 1000 hours from the commencement of the durability test, and a working current increased by 2% on average. Thus, the reliability of the semiconductor laser in Example 5 was enhanced remarkably.

As described above, according to the first and second methods for producing a semiconductor device of the present invention, the surface of a first semiconductor layer made of nitride-based compound semiconductor can be cleaned while the flatness of the surface is maintained. Therefore, according to the method of the present invention, a second semiconductor layer made of a nitride-based compound semiconductor with good crystallinity can be grown on the first semiconductor layer. Consequently, a semiconductor device with good characteristics and high reliability can be produced.

The method for producing a semiconductor device of the present invention is applicable to a semiconductor device in which at least two Group III nitride-based compound semiconductors are layered. For example, the method is applicable to a semiconductor laser, a light-emitting diode, an FET, and the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a semiconductor device, comprising:
   (a) soaking a first semiconductor layer made of a Group III nitride-based compound semiconductor in an alkaline aqueous solution under a condition that a current is not flowing through the first semiconductor layer and under a condition that light having an energy equal to or higher than a bandgap energy of the Group III nitride-based compound semiconductor is not radiated to the first semiconductor layer; and
   (b) after the process (a), growing a second semiconductor layer made of a Group III nitride-based compound semiconductor on the first semiconductor layer,
   wherein an oxide layer or an impurity on a surface of the first semiconductor layer is removed by the soaking, substantially without etching the first semiconductor layer.

2. A method for producing a semiconductor device according to claim 1, further comprising, after the process (a) and before the process (b) heating the first semiconductor layer in gas containing nitrogen atoms.

3. A method for producing a semiconductor device according to claim 2, wherein the gas contains at least one selected from the group consisting of nitrogen gas, ammonia, hydrazine, and a hydrazine derivative.

4. A method for producing a semiconductor device according to claim 2, wherein the first semiconductor layer is heated at a temperature in a range of 500° C. to 1000° C. in the heating process.

* * * * *